(12) United States Patent
Xiong et al.

(10) Patent No.: US 11,747,934 B2
(45) Date of Patent: *Sep. 5, 2023

(54) DISPLAY PANEL AND DISPLAY DEVICE

(71) Applicant: KUNSHAN GO-VISIONOX OPTO-ELECTRONICS CO., LTD, Jiangsu (CN)

(72) Inventors: Shuihu Xiong, Kunshan (CN); Feng Guo, Kunshan (CN); Yongxue Hu, Kunshan (CN); Lingling Zhao, Kunshan (CN); Kai Feng, Kunshan (CN)

(73) Assignee: KUNSHAN GO-VISIONOX OPTO-ELECTRONICS CO., LTD, Kunshan (CN)

(*) Notice: Subject to any disclaimer, the term of this patent is extended or adjusted under 35 U.S.C. 154(b) by 67 days.

This patent is subject to a terminal disclaimer.

(21) Appl. No.: 17/474,321

(22) Filed: Sep. 14, 2021

(65) Prior Publication Data

US 2021/0405806 A1    Dec. 30, 2021

Related U.S. Application Data

(63) Continuation of application No. PCT/CN2020/079272, filed on Mar. 13, 2020.

(30) Foreign Application Priority Data

Jul. 30, 2019   (CN) .......................... 201910696821.6

(51) Int. Cl.
G06F 3/041    (2006.01)
H01L 33/52   (2010.01)
H01L 33/58   (2010.01)

(52) U.S. Cl.
CPC .......... *G06F 3/0416* (2013.01); *G06F 3/0412* (2013.01); *H01L 33/52* (2013.01); *H01L 33/58* (2013.01)

(58) Field of Classification Search
CPC ...... G06F 3/041; G06F 3/0412; G06F 3/0416; G09F 9/00; H01L 33/52; H01L 33/58
See application file for complete search history.

(56) References Cited

U.S. PATENT DOCUMENTS

2011/0210407 A1*   9/2011   Katayama .............. C08G 73/14
                                                    257/E29.166
2013/0135184 A1*   5/2013   Tung ................... B81C 1/00317
                                                    359/291

(Continued)

FOREIGN PATENT DOCUMENTS

CN      201654737 U      11/2010
CN      202870775 U       4/2013

(Continued)

OTHER PUBLICATIONS

International Search Report dated Jun. 19, 2020 in corresponding International application No. PCT/CN2020/079272 ; 4 pages.

(Continued)

*Primary Examiner* — Ryan A Lubit
(74) *Attorney, Agent, or Firm* — Maier & Maier, PLLC

(57) ABSTRACT

A display panel includes a first substrate, a light-emitting functional layer, a second substrate, an optical adhesive layer and a polarizer stacked in sequence. The display panel includes a display area and a non-display area. The display panel further includes a touch-control driving plate disposed on a surface of a first portion of the second substrate facing away from the light-emitting functional layer. The first portion of the second substrate is in the non-display area. The optical adhesive layer covers a second portion of the touch-control driving plate. A distance between a surface of (Continued)

the optical adhesive layer facing away from the light-emitting functional layer and the light-emitting functional layer is greater than or equal to a distance between a surface of the touch-control driving plate facing away from the light-emitting functional layer and the light-emitting functional layer.

13 Claims, 3 Drawing Sheets

(56) References Cited

U.S. PATENT DOCUMENTS

| | | | |
|---|---|---|---|
| 2013/0169576 A1* | 7/2013 | Wang | G06F 3/041 345/173 |
| 2014/0168530 A1* | 6/2014 | Lin | G06F 3/0412 349/12 |
| 2014/0168531 A1 | 6/2014 | Lin | |
| 2017/0277313 A1 | 9/2017 | Lee et al. | |
| 2018/0123084 A1* | 5/2018 | Kim | H10K 50/8426 |
| 2021/0405801 A1* | 12/2021 | Deng | H10K 59/40 |

FOREIGN PATENT DOCUMENTS

| | | |
|---|---|---|
| CN | 103729079 A | 4/2014 |
| CN | 103885235 A | 6/2014 |
| CN | 103970336 A | 8/2014 |
| CN | 204903920 U | 12/2015 |
| CN | 106505089 A | 3/2017 |
| CN | 107464824 A | 12/2017 |
| CN | 109254696 A | 1/2019 |
| CN | 109782951 A | 5/2019 |
| CN | 110262702 A | 9/2019 |
| CN | 110377184 A | 10/2019 |
| TW | 201619789 A | 6/2016 |
| TW | 201921231 A | 6/2019 |

OTHER PUBLICATIONS

First Office Action and Search Report dated Jan. 29, 2021 in corresponding Chinese application No. 201910696821.6; 15 pages including Machine-generated English-language translation.

Second Office Action and Search Report dated Jul. 21, 2021 in corresponding Chinese application No. 201910696821.6; 14 pages including Machine-generated English-language translation.

Office Action and Search Report dated Sep. 18, 2020 in corresponding Taiwanese application No. 109108825; 11 pages including Machine-generated English-language translation.

* cited by examiner

DISPLAY PANEL AND DISPLAY DEVICE

CROSS-REFERENCE TO RELATED APPLICATION

This is a continuation of International Patent Application NO. PCT/CN2020/079272, filed on Mar. 13, 2020, which claims priority to Chinese patent application No. 201910696821.6 filed on Jul. 30, 2019, disclosures of which are incorporated herein by reference in their entireties.

TECHNICAL FIELD

Embodiments of the present disclosure relate to a technology of narrow bezel, in particular to a display panel and a display device.

BACKGROUND

As the display technology progresses, a "truly full screen" becomes a goal that many display panel manufacturers pursue.

However, a display panel in the related technology still has a relatively large bezel that cannot be reduced and still has a relatively small screen-to-body ratio.

SUMMARY

The present disclosure provides a display panel and a display device to reduce a bezel of the display panel and improve a screen-to-body ratio of the display panel.

The present disclosure provides a display panel, the display panel includes a first substrate, a light-emitting functional layer, a second substrate, an optical adhesive layer and a polarizer stacked in sequence;

the display panel includes a display area and a non-display area located on at least one side of the display area; the display panel further includes a touch-control driving plate disposed on a surface of a first portion of the second substrate facing away from the light-emitting functional layer, the first portion of the second substrate is in the non-display area, the optical adhesive layer covers a second portion of the touch-control driving plate, a distance between a surface of the optical adhesive layer facing away from the light-emitting functional layer and the light-emitting functional layer is greater than a distance between a surface of the touch-control driving plate facing away from the light-emitting functional layer and the light-emitting functional layer.

The present disclosure further provides a display device. The display device includes the preceding display panel.

In embodiments of the present disclosure, the display panel includes a first substrate, a light-emitting functional layer, a second substrate, an optical adhesive layer and a polarizer stacked in sequence, the display panel includes a display area and a non-display area located on at least one side of the display area; the display panel further includes a touch-control driving plate disposed on a surface of a first portion of the second substrate facing away from the light-emitting functional layer, the first portion of the second substrate is in the non-display area, the optical adhesive layer covers a second portion of the touch-control driving plate, a distance between a surface of the optical adhesive layer facing away from the light-emitting functional layer and the light-emitting functional layer is greater than a distance between a surface of the touch-control driving plate facing away from the light-emitting functional layer and the light-emitting functional layer. Since the touch-control driving plate is bound to the second substrate and the polarizer is attached to the optical adhesive layer, the attaching surface between the polarizer and the optical adhesive layer is higher than the surface of the touch-control driving plate facing away from the second substrate. There is no need to reserve a preset distance between the touch-control driving plate and the polarizer to avoid interference between the binding process of the touch-control driving plate and the attaching process of the polarizer. In this manner, a bezel of the display panel is reduced, and a screen-to-body ratio of the display panel is improved; the difficulty of the attaching process of the polarizer is reduced, and the yield of the display panel is improved; the reliability of the connection between the touch-control driving plate and the display panel is increased, and the stability of the display panel is improved.

DETAILED DESCRIPTION

Figure 1:
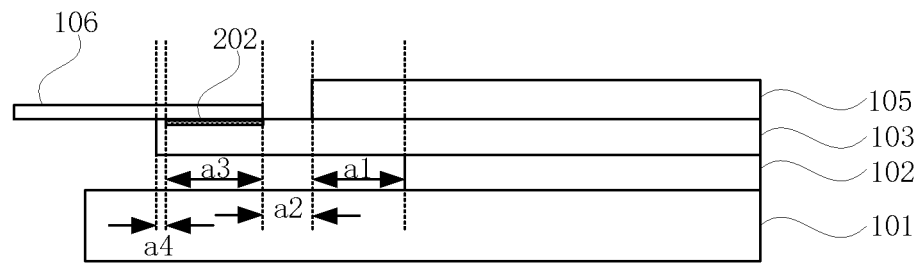
FIG. 1 is a structure view of a display panel according to the related technology.

The present disclosure is described hereinafter in conjunction with drawings and embodiments. The embodiments described herein are intended to explain and not to limit the present disclosure. For ease of description, only part, not all, of structures related to the present disclosure are illustrated in the drawings.

For display panels of the related technology, for example, for a display panel with touch-control function, there is need to reserve at least one step for binding touch-control driving plate, the at least one step occupies a relatively large space. Other components (such as a polarizer) need to avoid the touch-control driving plate. As a result, the display panel has a relatively large bezel. FIG. 1 is a structure view of a display panel according to the related technology. As shown in FIG. 1, the display panel includes a first substrate 101, a light-emitting functional layer 102, a second substrate 103 and a polarizer 105, and the second substrate 103 is provided with a touch-control welding pad 202 for binding the second substrate 103 to a touch-control driving plate 106. A gap a1 is required between the boundary of the polarizer 105 in a non-display area and the boundary of the light-emitting functional layer 102 (the display area of the display panel) to ensure that light leak of the polarizer 105 is invisible in the display area. A preset distance a2 is required between the polarizer 105 and the touch-control driving plate 106 to avoid interference between the binding process of the touch-control driving plate 106 and the attaching process of the polarizer 105. The touch-control welding pad 202 needs to have a width a3 to ensure the stability of the electrical connection between the touch-control driving plate 106 and the touch-control welding pad 202. A distance a4 is required between the touch-control welding pad 202 and an edge of the second substrate 103 to ensure the stability of the touch-control welding pad 202 when the second substrate 103 is cut. Therefore, the width of the bezel of the display panel is at least a1+a2+a3+a4. This results in a relatively wide bezel.

In view of the preceding problem, the present disclosure provides the solution below.

Figure 2:
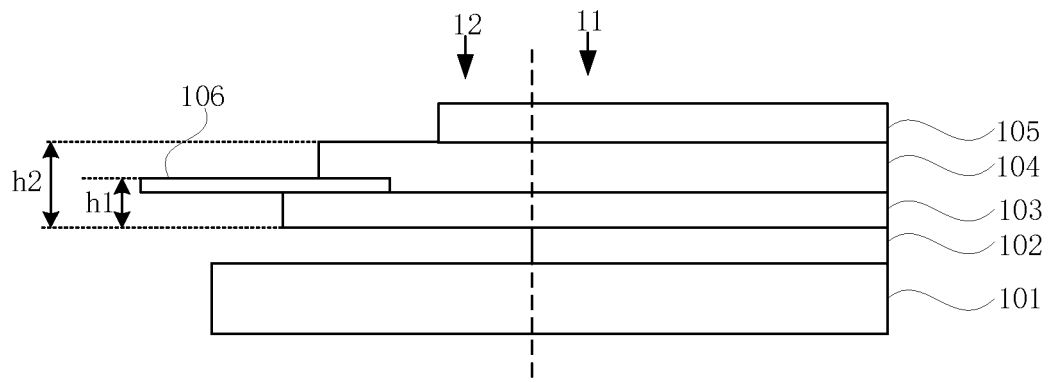
FIG. 2 is a structure view of a display panel according to an embodiment of the present disclosure.

FIG. 2 is a structure view of a display panel according to an embodiment of the present disclosure. Referring to FIG. 2, the display panel includes a first substrate 101, a light-emitting functional layer 102, a second substrate 103, an optical adhesive layer 104 and a polarizer 105 stacked in sequence.

The display panel includes a display area 11 and a non-display area 12 located on at least one side of the display area 11. The display panel further includes a touch-control driving plate 106 disposed on a surface of a first portion of the second substrate 103 facing away from the light-emitting functional layer 102. The first portion of the second substrate 103 is in the non-display area 12. The optical adhesive layer 104 covers a second portion of the touch-control driving plate 106. A distance h2 between a surface of the optical adhesive layer 104 facing away from the light-emitting functional layer 102 and the light-emitting functional layer 102 is greater than a distance h1 between a surface of the touch-control driving plate 106 facing away from the light-emitting functional layer 102 and the light-emitting functional layer 102.

The optical adhesive layer 104 is disposed between the second substrate 103 and the polarizer 105. The distance h2 between the surface of the optical adhesive 104 facing away from the light-emitting functional layer 102 and the light-emitting functional layer 102 is greater than the distance h1 between the surface of the touch-control driving plate 106 facing away from the light-emitting functional layer 102 and the light-emitting functional layer 102. Since the polarizer 105 is attached to the optical adhesive layer 104, the attaching surface between the polarizer 105 and the optical adhesive layer 104 is higher than the surface of the touch-control driving plate 106 facing away from the second substrate 103. When the polarizer 105 is attached to the surface of the optical adhesive layer 104, an edge of the polarizer 105 will not collide with the touch-control driving plate 106. That is, there is no need to reserve a preset distance between the touch-control driving plate 106 and the polarizer 105 to avoid interference between the binding process of the touch-control driving plate 106 and the attaching process of the polarizer 105. That is, along a direction parallel to the second substrate 103, a distance between the polarizer 105 and the touch-control driving plate 106 may be less than the preset distance. Alternatively, the vertical projection of the polarizer 105 on the second substrate 103 may partially overlap the vertical projection of the touch-control driving plate 106 on the second substrate 103. In this manner, the bezel of the display panel is reduced, and the screen-to-body ratio of the display panel is improved. Here the preset distance is determined based on the alignment precision in an attachment between the polarizer 105 and the touch-control driving plate 106 in the related technology. For example, the preset distance may be 0.2 mm.

Moreover, the optical adhesive layer 104 covers a second portion of the touch-control driving plate 106, the polarizer 105 can be disposed at any position on the optical adhesive layer 104 under a premise of ensuring that the display panel has a relatively small bezel, so that there is relatively less restrictive conditions when the polarizer 105 is attached to the optical adhesive layer 104, the difficulty in the attaching process is reduced, and the yield of the display panel is improved. Additionally, the optical adhesive layer 104 covers a second portion of the touch-control driving plate 106, so that the optical adhesive layer 104 can protect and fix the touch-control driving plate 106, thereby increasing the reliability of the connection between the touch-control driving plate 106 and the second substrate 103, preventing the touch-control driving plate 106 from falling off when the display panel is subjected to an external force, and improving the stability of the display panel.

For the solution of this embodiment, the optical adhesive layer covers a second portion of the touch-control driving plate, and the distance between the surface of the optical adhesive layer facing away from the light-emitting functional layer and the light-emitting functional layer is greater than the distance between the surface of the touch-control driving plate facing away from the light-emitting functional layer and the light-emitting functional layer. Since the touch-control driving plate is attached to the second substrate and the polarizer is attached to the optical adhesive layer, the attaching surface between the polarizer and the optical adhesive layer is higher than the surface of the touch-control driving plate facing away from the second substrate. There is no need to reserve a preset distance between the touch-control driving plate and the polarizer to avoid interference between the binding process of the touch-control driving plate and the attaching process of the polarizer. In this manner, the bezel of the display panel is reduced, and the screen-to-body ratio of the display panel is improved; the difficulty in the attaching process of the polarizer is reduced, and the yield of the display panel is improved; the reliability of the connection between the touch-control driving plate and the second substrate is increased, and the stability of the display panel is improved.

Figure 3:
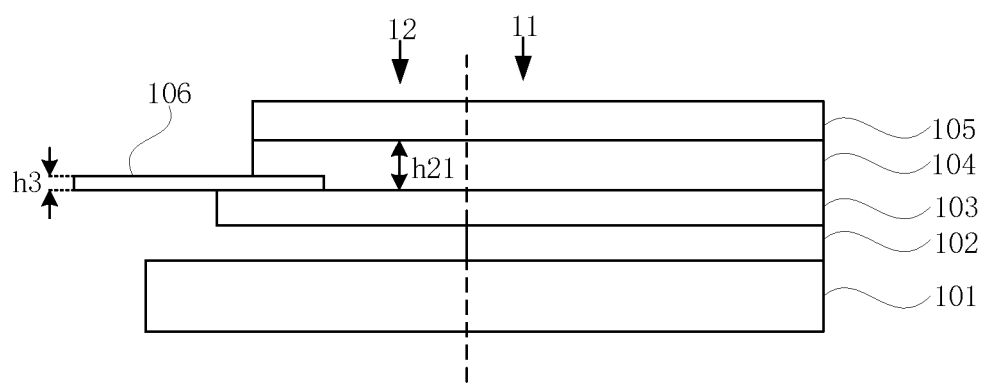
FIG. 3 is a structure view of another display panel according to an embodiment of the present disclosure.

FIG. 3 is a structure view of another display panel according to an embodiment of the present disclosure. Referring to FIG. 3, the vertical projection of the polarizer 105 on the second substrate 103 partially overlaps the vertical projection of the touch-control driving plate 106 on the second substrate 103.

With this arrangement, there is no gap between the polarizer 105 and the touch-control driving plate 106 along a direction parallel to the display panel so that the bezel of the display panel can be minimized; a sum of a length of the polarizer 105 in the non-display area 12 and a binding length between the touch-control driving plate 106 and the second substrate 103 is reduced, so that the bezel of the display panel is reduced and the screen-to-body ratio of the display panel is improved.

Continue to refer to FIG. 3, a thickness h21 of a third portion of the optical adhesive layer 104 not covering the touch-control driving plate 106 is twice or more than twice a thickness h3 of the touch-control driving plate 106.

If the thickness of the optical adhesive layer 104 is relatively small, the fluidity of the optical adhesive layer 104 is relatively poor. After the optical adhesive layer 104 is formed on the second substrate 103, because the fluidity of the optical adhesive layer 104 is relatively poor, a gap is formed between the optical adhesive layer 104 and a lateral edge of the touch-control driving plate 106 adjacent to the light-emitting functional layer 102, and light will be reflected or refracted in the gap formed between the optical adhesive layer 104 and the touch-control driving plate 106. As a result, a white bright streak is easily seen in the display area 11, thereby seriously affecting the display effect. With the configuration in which the thickness h21 of the third portion of the optical adhesive layer 104 not covering the touch-control driving plate 106 is twice or more than twice the thickness h3 of the touch-control driving plate 106, the fluidity of the optical adhesive layer 104 is relatively good. Thus, after the optical adhesive layer 104 is formed on the surface of the second substrate 103, the optical adhesive layer 104 is in sufficient contact with the lateral edge of the touch-control driving plate 106 adjacent to the light-emitting functional layer 102. In this case, no gap is formed between the optical adhesive layer 104 and the touch-control driving plate 106, and no reflection of light in the gap between the optical adhesive layer 104 and the touch-control driving plate 106 is seen in the display area 11, so the display effect is improved. Moreover, the thickness of the fifth portion of the optical adhesive layer 104 covering the touch-control driving plate 106 is relatively large, so that the optical adhesive layer 104 can better protect and fix the touch-control driving plate 106, thereby increasing the reliability of the connection between the touch-control driving plate 106 and the second substrate 103, preventing the touch-control driving plate 106 from falling off when the display panel is subjected to an external force, and improving the stability of the display panel.

In an embodiment, the thickness h21 of the third portion of the optical adhesive layer 104 not covering the touch-control driving plate 106 ranges from 40 microns to 200 microns. With the configuration in which the thickness of the optical adhesive layer 104 is greater than or equal to 40 microns, the fluidity of the optical adhesive layer 104 is relatively good. Thus, after the optical adhesive layer 104 is formed on the surface of the second substrate 103, the optical adhesive layer 104 is in sufficient contact with the lateral edge of the touch-control driving plate 106 adjacent to the light-emitting functional layer 102. In this case, no gap is formed between the optical adhesive layer 104 and the touch-control driving plate 106, and no reflection of light in the gap between the optical adhesive layer 104 and the touch-control driving plate 106 is seen in the display area 11, so the display effect is improved.

Moreover, when the thickness of the optical adhesive layer 104 is relatively large, the overall thickness of the display panel is relatively large. With the configuration in which the thickness of the optical adhesive layer 104 is less than or equal to 200 microns, the overall thickness of the display panel is relatively small, which conforms to the development trend of light and thin display panel.

Figure 4:
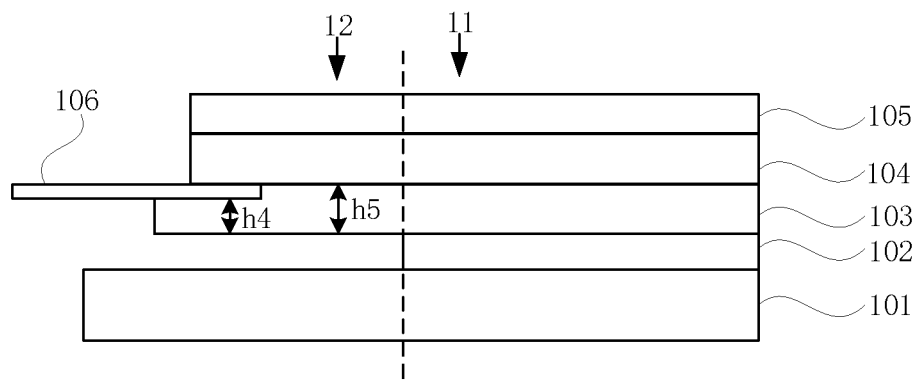
FIG. 4 is a structure view of another display panel according to an embodiment of the present disclosure.

In an embodiment, FIG. 4 is a structure view of another display panel according to an embodiment of the present disclosure. Referring to FIG. 4, a thickness h4 of a first portion of the second substrate 103 provided with the touch-control driving plate 106 is less than a thickness h5 of a fourth portion of the second substrate 103 located in the display area 11.

The first portion of the second substrate 103 provided with the touch-control driving plate 106 is thinned to form a thinned area, after the touch-control driving plate 106 is disposed in the thinned area, the height difference between the surface of the touch-control driving plate 106 facing away from the second substrate 103 and an upper surface of a non-thinned portion of the second substrate 103 is reduced. In this manner, a relatively thin optical adhesive layer 104 can cover the touch-control driving plate 106. Moreover, since the height difference is relatively small, the optical adhesive can well contact with the lateral edge of the touch-control driving plate 106 adjacent to the light-emitting functional layer 102, so that no gap will appear, the display effect will not be affected.

Figure 5:
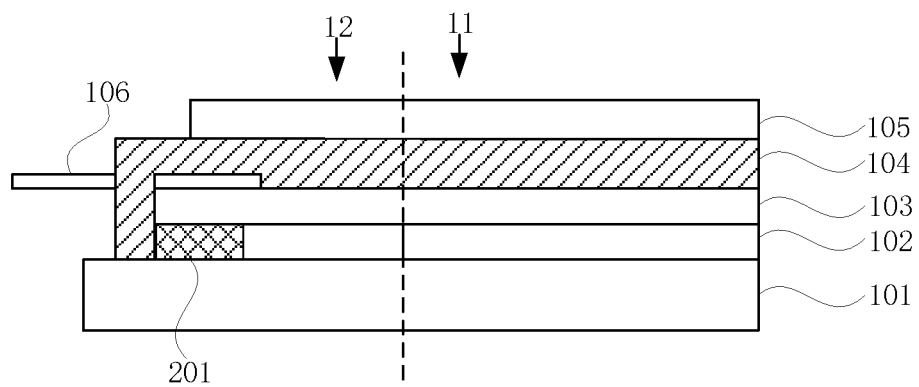
FIG. 5 is a structure view of another display panel according to an embodiment of the present disclosure.

FIG. 5 is a structure view of another display panel according to an embodiment of the present disclosure, referring to FIG. 5, the optical adhesive layer 104 covers a lateral edge of the first portion of the second substrate 103 provided with the touch-control driving plate 106.

When the optical adhesive layer 104 is formed, the optical adhesive layer 104 may cover the lateral edge of the first portion of the second substrate 103, and the first portion of the second substrate 103 is provided with the touch-control driving plate 106. The second substrate 103 may crack during a cutting process or for other reasons. The optical adhesive layer 104 can protect the lateral edge of the first portion of the second substrate 103 provided with the touch-control driving plate 106 and prevent the crack formed at the lateral edge of the first portion of the second substrate 103 provided with the touch-control driving plate 106 from spreading, thereby preventing the second substrate 103 from damaging, thereby preventing the display effect from being affected, thereby avoiding shortening the service life of the display panel. Moreover, the optical adhesive layer 104 may be in contact with the first substrate 101, and can cover a film (such as a glass powder encapsulation layer 201) between the first substrate 101 and the second substrate 103 to increase the reliability of the connection between a plurality of films of the display panel.

In an embodiment, the optical adhesive layer 104 is a heat curing adhesive layer.

When heated to a certain temperature, the heat curing adhesive layer can be shaped. Since the heat curing adhesive layer has a certain liquidity, after the optical adhesive layer 104 is formed on the second substrate 103, the optical adhesive layer 104 can sufficiently contact with the touch-control driving plate 106. Thus, no gap is formed between the optical adhesive layer 104 and the touch-control driving plate 106, no reflection of light will appear in the gap, and no white bright streak is seen in the display area 11. In this manner, the display effect is improved.

In an embodiment, the optical adhesive layer 104 is doped with at least one of phenolic resin, melamine resin, epoxy resin and polyurethane resin.

The phenolic resin, the melamine resin, the epoxy resin or the polyurethane resin can be cured when heated. The material doped in the optical adhesive layer 104 may be determined according to the curing temperature required for the heat curing adhesive layer. The cost of the phenolic resin, the melamine resin, the epoxy resin or the polyurethane resin are low, thus the overall cost of the display panel will be reduced.

The optical adhesive layer 104 used in this embodiment may also be doped with other heat curing materials, for example, the optical adhesive layer 104 can be doped with acrylic. The heat curing adhesive layer is formed by the acrylic added with a functional group that has a heat curing effect and that is insoluble and insoluble in the acrylic series. The material of the heat curing adhesive layer is not limited in this embodiment of the present disclosure.

In an embodiment, the polarizer 105 may be a glueless polarizer. Since the optical adhesive layer 104 has a function of paste, the polarizer 105 is attached to the surface of the optical adhesive layer 104, thereby saving the overall cost of the display panel.

Figure 6:
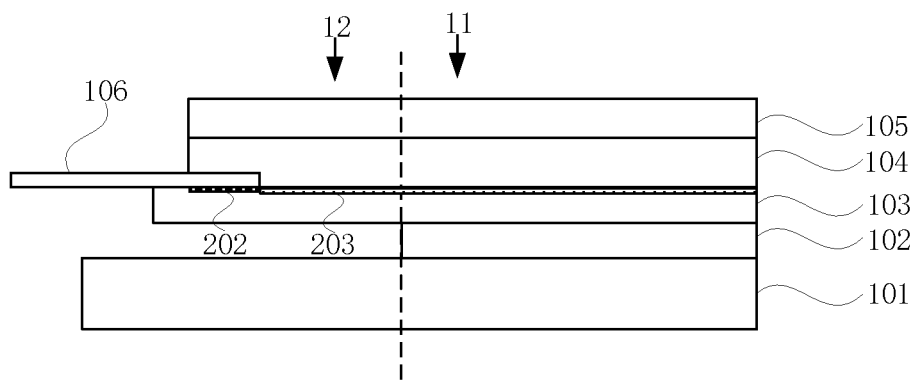
FIG. 6 is a structure view of another display panel according to an embodiment of the present disclosure.

In an embodiment, FIG. 6 is a structure view of another display panel according to an embodiment of the present disclosure. Referring to FIG. 6, the second substrate 103 includes an encapsulation glass or a thin-film encapsulation layer, and the second substrate 103 further includes a touch-control electrode layer 203.

The touch-control electrode layer 203 is disposed on a surface of the encapsulation glass facing away from the first substrate 103, or the touch-control electrode layer 203 is disposed on a surface of the thin-film encapsulation layer facing away from the first substrate 103.

Figure 7:
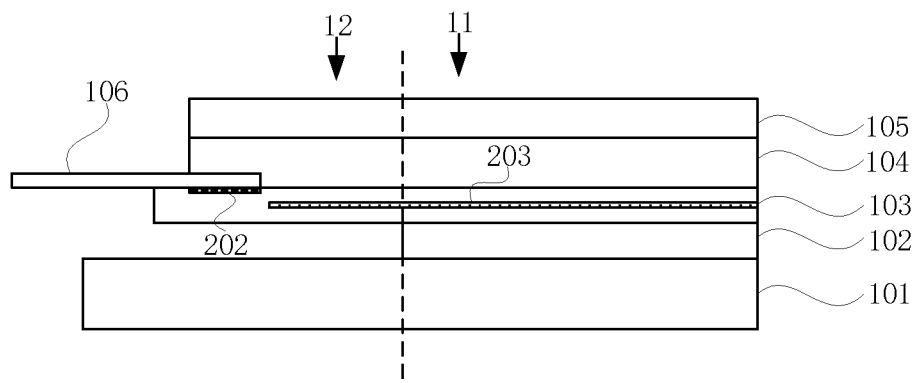
FIG. 7 is a structure view of another display panel according to an embodiment of the present disclosure.

Alternatively, the touch-control electrode layer 203 is disposed in the thin-film encapsulation layer as shown in FIG. 7, a structure view of another display panel according to an embodiment of the present disclosure. With this arrangement, the display panel has a relatively small thickness, which conforms to the development trend of light and thin display panel.

The second substrate 103 is an encapsulation substrate. When the second substrate is an encapsulation glass, the touch-control electrode layer 203 may be formed on the surface of the glass and electrically connected to the touch-control driving plate 106 through the touch-control welding pad 202. When the second substrate 103 is a thin-film encapsulation layer, the touch-control electrode layer 203 may be formed on the surface of the thin-film encapsulation layer or in the thin-film encapsulation layer.

Figure 8:
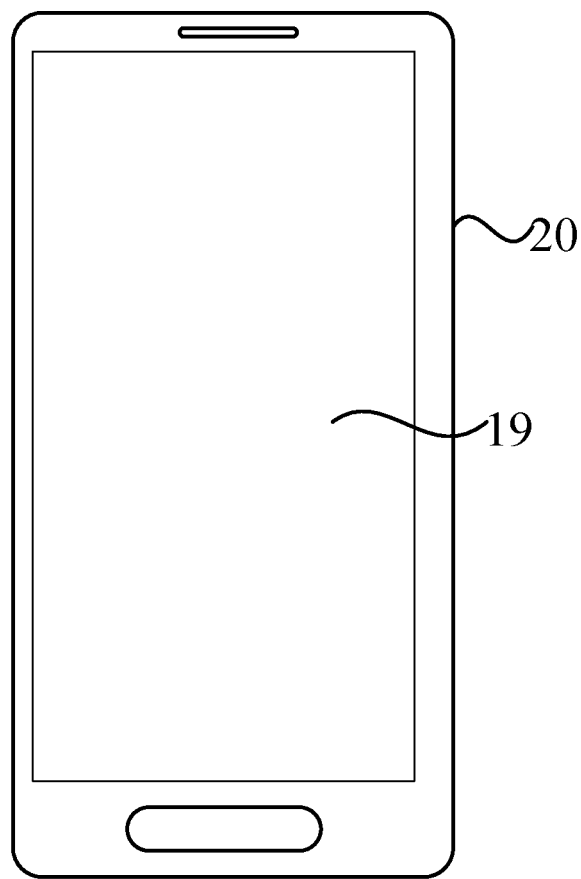
FIG. 8 is a structure view of a display device according to an embodiment of the present disclosure.

FIG. 8 is a structure view of a display device according to an embodiment of the present disclosure. Referring to FIG. 8, the display device 20 includes the display panel 19 provided in any embodiment of the present disclosure. The display device provided in any embodiment of the present disclosure may be a display device having the display function, such as a mobile phone, a computer or a smart wearable device, the embodiments of the present application are not limited to these.

The display device provided in this embodiment of the present disclosure includes the display panel provided in any embodiment of the present disclosure and has the same functions and effects as the display panel provided in any embodiment of the present disclosure. These functions and effects are not repeated here.

What is claimed is:

1. A display panel, comprising:
a first substrate, a light-emitting functional layer, a second substrate, an optical adhesive layer and a polarizer stacked in sequence,
wherein the display panel comprises a display area and a non-display area located on at least one side of the display area;
the display panel further comprises a touch-control driving plate disposed on a surface of a first portion of the second substrate facing away from the light-emitting functional layer, the first portion of the second substrate is in the non-display area; the optical adhesive layer covers a second portion of the touch-control driving plate; a distance between a surface of the optical adhesive layer facing away from the light-emitting functional layer and the light-emitting functional layer is greater than a distance between a surface of the touch-control driving plate facing away from the light-emitting functional layer and the light-emitting functional layer;
wherein a thickness of a third portion of the optical adhesive layer not covering the touch-control driving plate is twice or more than twice a thickness of the touch-control driving plate.

2. The display panel of claim 1, wherein a vertical projection of the polarizer on the second substrate partially overlaps a vertical projection of the touch-control driving plate on the second substrate.

3. The display panel of claim 1, wherein a thickness of the third portion of the optical adhesive layer not covering the touch-control driving plate ranges from 40 microns to 200 microns.

4. The display panel of claim 1, wherein a thickness of the first portion of the second substrate provided with the touch-control driving plate is less than a thickness of a fourth portion of the second substrate located in the display area.

5. The display panel of claim 1, wherein the optical adhesive layer covers a lateral edge of the first portion of the second substrate, and the first portion of the second substrate is provided with the touch-control driving plate.

6. The display panel of claim 1, wherein the optical adhesive layer is a heat curing adhesive layer.

7. The display panel of claim 6, wherein the optical adhesive layer is doped with at least one of phenolic resin, melamine resin, epoxy resin and polyurethane resin.

8. The display panel of claim 1, wherein the second substrate comprises an encapsulation glass, and the second substrate further comprises a touch-control electrode layer;
the touch-control electrode layer is disposed on a surface of the encapsulation glass facing away from the first substrate; and
the touch-control electrode layer is electrically connected to the touch-control driving plate.

9. The display panel of claim 1, wherein the second substrate comprises a thin-film encapsulation layer, and the second substrate further comprises a touch-control electrode layer;
the touch-control electrode layer is disposed on a surface of the thin-film encapsulation layer facing away from the first substrate, or the touch-control electrode layer is disposed in the thin-film encapsulation layer; and
the touch-control electrode layer is electrically connected to the touch-control driving plate.

10. A display panel, comprising:
a first substrate, a light-emitting functional layer, a second substrate, an optical adhesive layer and a polarizer stacked in sequence,
wherein the display panel comprises a display area and a non-display area located on at least one side of the display area;
the display panel further comprises a touch-control driving plate disposed on a surface of a first portion of the second substrate facing away from the light-emitting functional layer, the first portion of the second substrate is in the non-display area; the optical adhesive layer covers a second portion of the touch-control driving plate; a distance between a surface of the optical adhesive layer facing away from the light-emitting functional layer and the light-emitting functional layer is greater than a distance between a surface of the touch-control driving plate facing away from the light-emitting functional layer and the light-emitting functional layer;
wherein the optical adhesive layer covers a lateral edge of the first portion of the second substrate, and the first portion of the second substrate is provided with the touch-control driving plate.

11. The display panel of claim 10, wherein a vertical projection of the polarizer on the second substrate partially overlaps a vertical projection of the touch-control driving plate on the second substrate.

12. The display panel of claim 10, wherein the second substrate comprises an encapsulation glass, and the second substrate further comprises a touch-control electrode layer;
    the touch-control electrode layer is disposed on a surface of the encapsulation glass facing away from the first substrate; and
    the touch-control electrode layer is electrically connected to the touch-control driving plate.

13. The display panel of claim 10, wherein the second substrate comprises a thin-film encapsulation layer, and the second substrate further comprises a touch-control electrode layer;
    the touch-control electrode layer is disposed on a surface of the thin-film encapsulation layer facing away from the first substrate, or the touch-control electrode layer is disposed in the thin-film encapsulation layer; and
    the touch-control electrode layer is electrically connected to the touch-control driving plate.

\* \* \* \* \*